(12) United States Patent
  Cook

(10) Patent No.: US 10,545,177 B2
(45) Date of Patent: *Jan. 28, 2020

(54) NON-CONTACT SENSOR BASED ROGOWSKI COIL

(71) Applicant: Veris Industries, LLC, Tualatin, OR (US)

(72) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 11 days.

This patent is subject to a terminal disclaimer.

(21) Appl. No.: 15/178,983

(22) Filed: Jun. 10, 2016

(65) Prior Publication Data

US 2017/0059623 A1 Mar. 2, 2017

Related U.S. Application Data

(60) Provisional application No. 62/213,445, filed on Sep. 2, 2015.

(51) Int. Cl.
  *G01R 15/18* (2006.01)

(52) U.S. Cl.
  CPC ................................ *G01R 15/181* (2013.01)

(58) Field of Classification Search
  None
  See application file for complete search history.

(56) References Cited

U.S. PATENT DOCUMENTS

| 4,709,339 | A | * | 11/1987 | Fernandes | G01K 1/024 324/127 |
| 5,414,400 | A |   | 5/1995  | Gris et al. |  |
| 5,582,395 | A |   | 12/1996 | Cheng |  |
| 5,973,501 | A | * | 10/1999 | Reichard | G01R 23/20 324/253 |
| 6,313,623 | B1 |   | 11/2001 | Kojovic et al. |  |
| 6,614,218 | B1 | * | 9/2003 | Ray | G01R 15/181 324/117 R |
| 7,227,441 | B2 |   | 6/2007  | Skendzic et al. |  |
| 7,227,442 | B2 |   | 6/2007  | Skendzic |  |
| 7,538,541 | B2 |   | 5/2009  | Kojovic |  |
| 7,564,233 | B2 |   | 7/2009  | Kojovic |  |
| 7,902,812 | B2 |   | 3/2011  | Kojovic |  |
| 7,986,968 | B2 |   | 7/2011  | Dobrowski et al. |  |
| 8,330,449 | B2 |   | 12/2012 | Greenberg |  |
| 8,872,611 | B2 |   | 10/2014 | Rouaud et al. |  |
| 9,329,659 | B2 |   | 5/2016  | Cook |  |
| 9,442,139 | B2 |   | 9/2016  | Hobelsberger et al. |  |
| 9,448,258 | B2 |   | 9/2016  | Garabieta et al. |  |
| 2004/0183522 | A1 | * | 9/2004 | Gunn | G01R 15/185 324/126 |
| 2007/0236208 | A1 | * | 10/2007 | Kojovic | H02H 1/0007 324/127 |
| 2008/0191704 | A1 |   | 8/2008 | Gholami et al. |  |
| 2009/0109589 | A1 | * | 4/2009 | Yoo | H02H 3/10 361/93.1 |

(Continued)

FOREIGN PATENT DOCUMENTS

WO 2006108021 A2 10/2006
WO 2012022779 A1 2/2012

*Primary Examiner* — Paresh Patel
(74) *Attorney, Agent, or Firm* — Chernoff, Vilhauer, McClung & Stenzel, LLP

(57) ABSTRACT

A coil that includes a current and a voltage sensor.

8 Claims, 21 Drawing Sheets

(56) References Cited

U.S. PATENT DOCUMENTS

| | | |
|---|---|---|
| 2011/0012587 A1 | 1/2011 | Greenberg |
| 2011/0043190 A1 | 2/2011 | Farr |
| 2013/0029245 A1* | 1/2013 | Fisher ................. G01R 1/06705 |
| | | 429/467 |
| 2013/0127448 A1* | 5/2013 | Hyacinthe ................. G01B 7/00 |
| | | 324/207.15 |
| 2016/0055963 A1 | 2/2016 | Lockstedt et al. |
| 2016/0091535 A1 | 3/2016 | Bannister et al. |
| 2016/0370408 A1* | 12/2016 | Meeker ................. G01R 15/16 |
| 2017/0059620 A1 | 3/2017 | Cook |
| 2017/0059621 A1 | 3/2017 | Cook |
| 2017/0059622 A1 | 3/2017 | Cook |
| 2017/0059624 A1 | 3/2017 | Cook |
| 2017/0059625 A1 | 3/2017 | Cook |
| 2018/0113161 A1* | 4/2018 | Hines ................... G01R 15/144 |

* cited by examiner

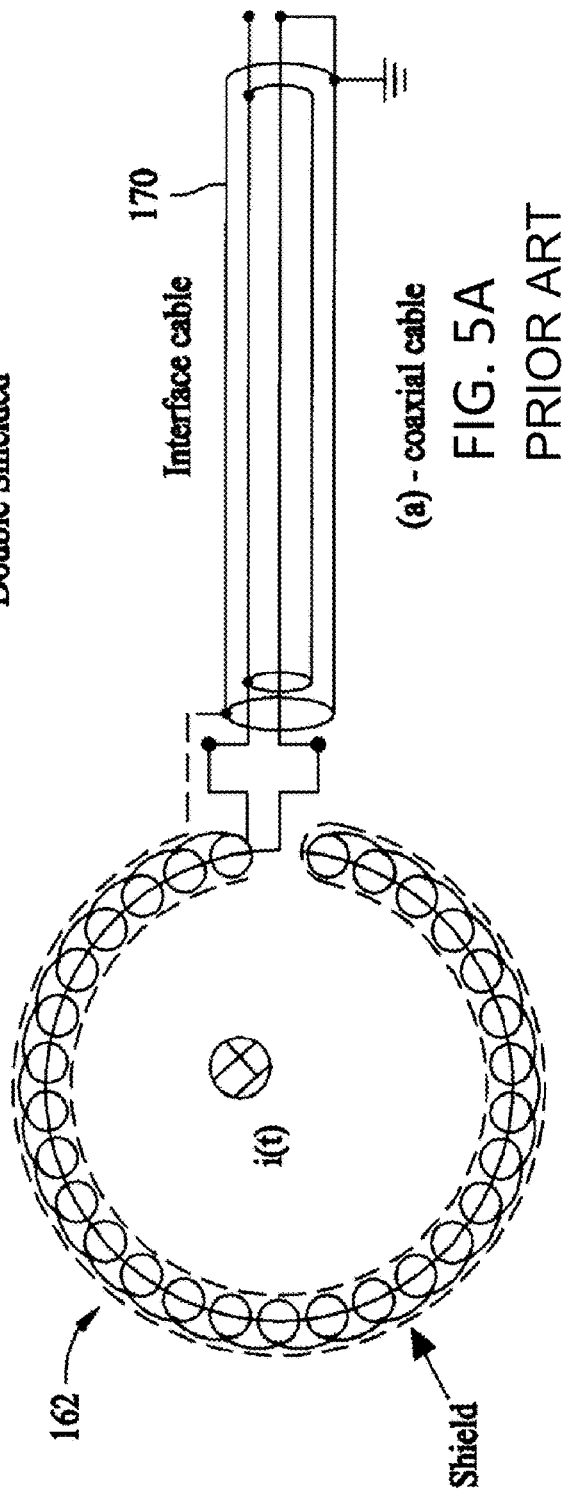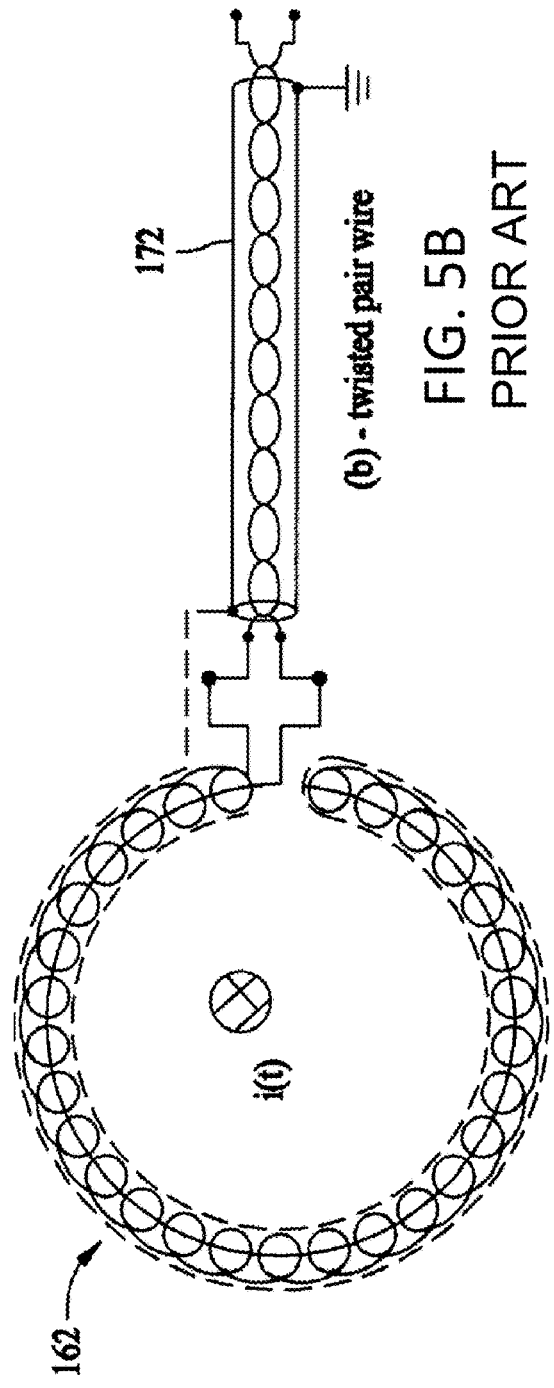
FIG. 5A PRIOR ART
FIG. 5B PRIOR ART

NON-CONTACT SENSOR BASED ROGOWSKI COIL

CROSS-REFERENCE TO RELATED APPLICATIONS

This application claims the benefit of U.S. Provisional App. No. 62/213,445, filed Sep. 2, 2015.

TECHNICAL FIELD

The present disclosure relates generally to a Rogowski coil.

BACKGROUND OF THE INVENTION

A number of different types of measurement devices may be utilized to detect or monitor current signals. For example, measurement devices are typically integrated into utility meters in order to monitor the current on one or more phases of an electrical power signal. In conventional devices, current transformers, shunts, and Hall Effect transducers are traditionally used to monitor current signals. More recently, Rogowski coils have been utilized to monitor current signals. With a Rogowski coil, current flowing through a conductor generates a magnetic field that induces a voltage in the coil. Using the voltage output signal of the coil, current conditions within the conductor can be calculated.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 5A illustrates a further modified Rogowski coil and connection.

FIG. 5B illustrates a further modified Rogowski coil and connection.

DETAILED DESCRIPTION OF PREFERRED EMBODIMENT

Figure 1:
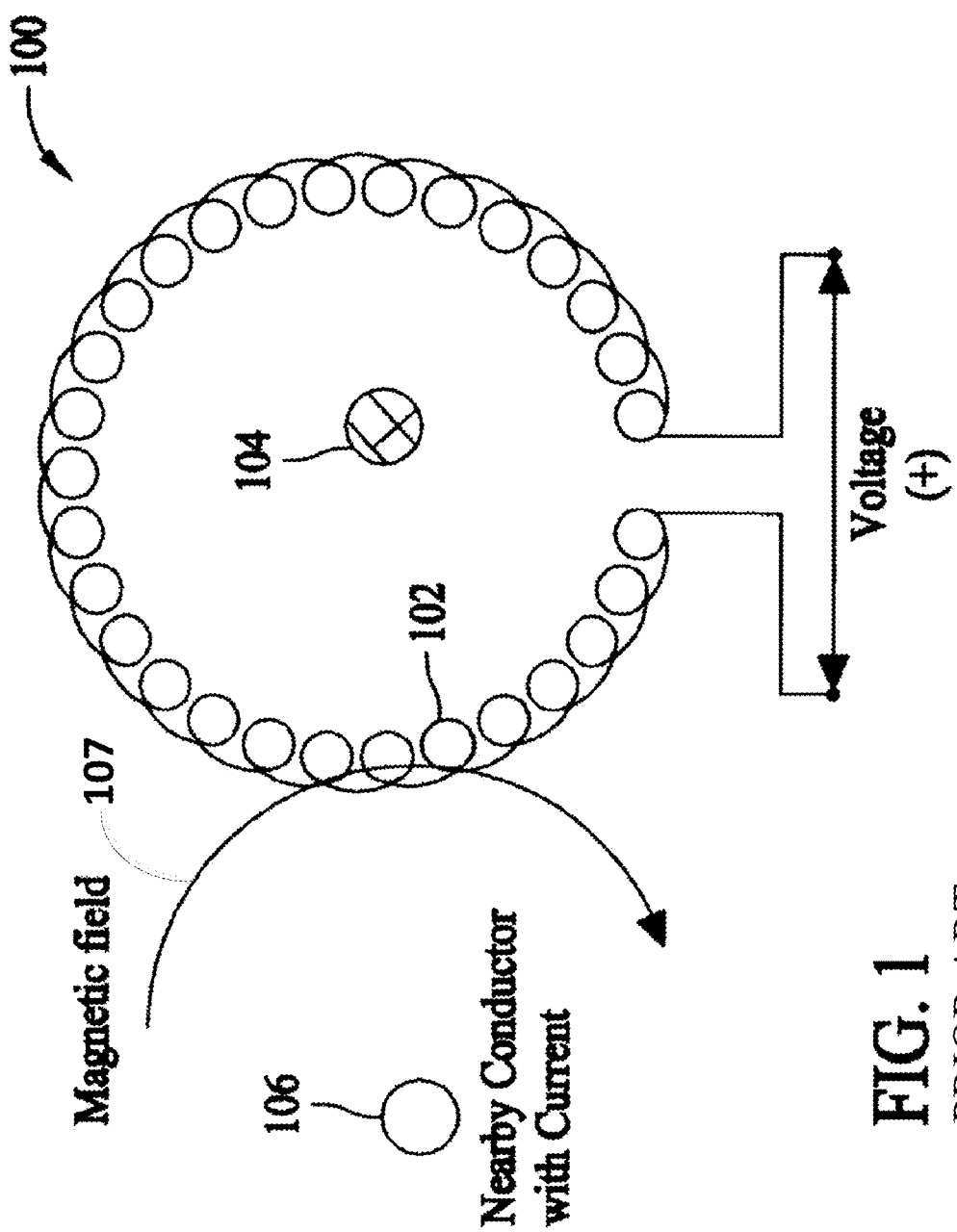
FIG. 1 illustrates a Rogowski coil, an internal conductor, and an external conductor.

Referring to FIG. 1, a Rogowski coil 100 is generally fabricated from a conductor 104, that may include a wire, that is coiled or wound on a substantially non-magnetic core, which may be, for example, air or a substantially non-magnetic material. The 102 coil may be placed around a conductor or conductors 104 whose current(s) is to be measured with the coil 100. A primary current flowing through the conductor 104 generates a magnetic field that, in turn, induces a voltage in the coil 102. A voltage output v(t) of the coil 102 is generally governed by the following Equation:

$$v(t) = -\mu_o \mu_r n S [d\, i(t)/d\, t] = -M [d\, i(t)/dt].$$

where $\mu_o$, is the magnetic permeability of free space, $\mu_r$ is the relative permeability (the ratio of the permeability of the coil 102 to the permeability of free space $\mu_o$), n is the winding density (turns per unit length), S is the cross sectional area of the core in the Rogowski coil, and M represents the mutual reactance or mutual coupling between the coil 102 and the conductor 104. In a similar manner, the output of the coil may be a current signal i(t).

For an ideal Rogowski coil 102, M is independent of the location of the conductor 104 within the coil 102. The Rogowski coil output voltage v(t) is proportional to the rate of change of the measured current i(t) flowing in the conductor 104. The coil output voltage v(t) may be integrated to determine the current i(t) in the conductor 104.

Figure 2A:
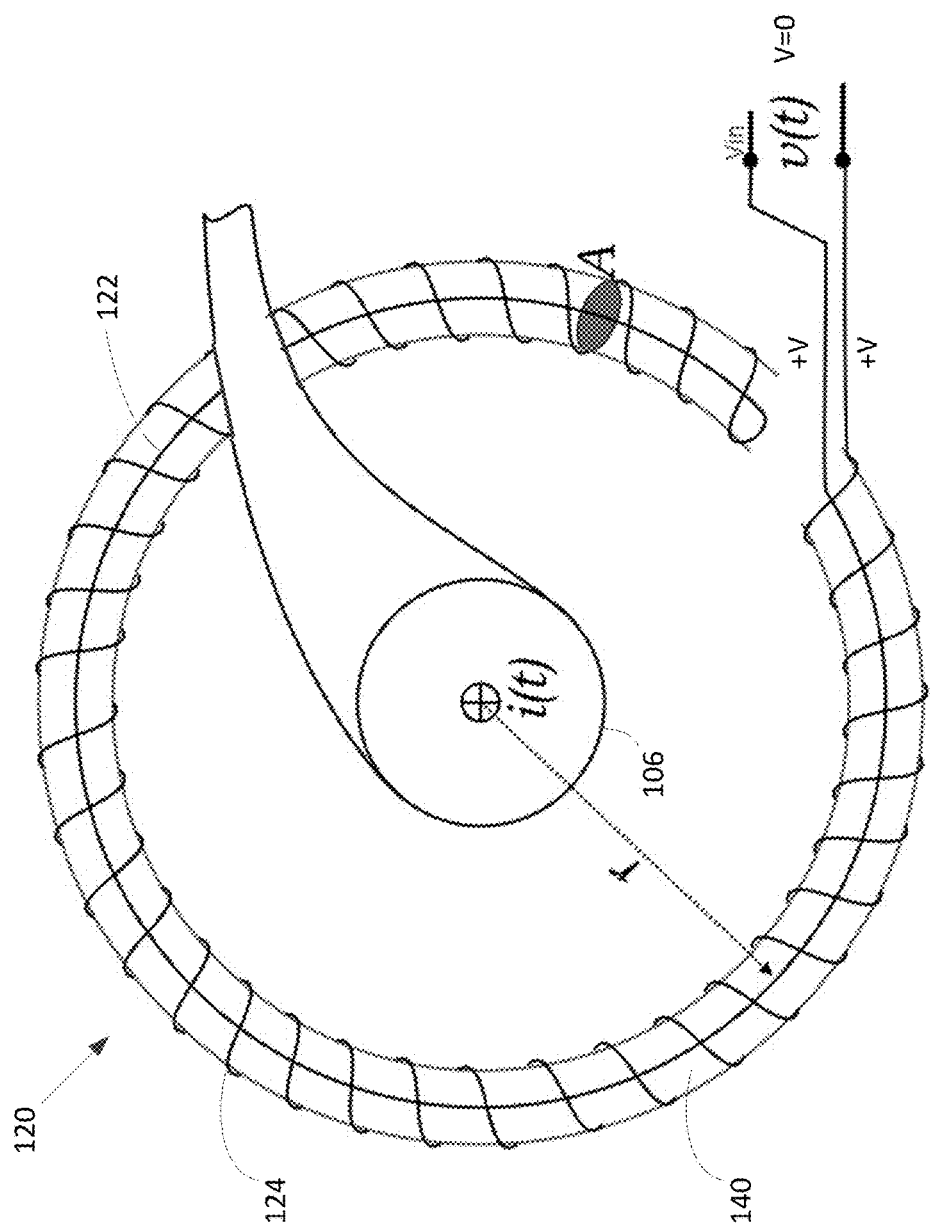
FIG. 2A illustrates a modified Rogowski coil.

Referring also to FIG. 2A, to reduce undesirable influence of a nearby conductor 106, which generates an electromagnetic field 107, a coil 120 may include first and second wire coils or loops 122, 124 wound in electrically opposite directions. The two coils 122, 124 effectively cancel substantially all electromagnetic fields coming from outside the coil 120. One or both loops 122, 124 may be configured from a wound wire on the core. If only one loop wire wound on a non-magnetic core is utilized, then the other loop may be returned through the center of the coil 120 to cancel undesirable effects of external magnetic fields.

Figure 2B:
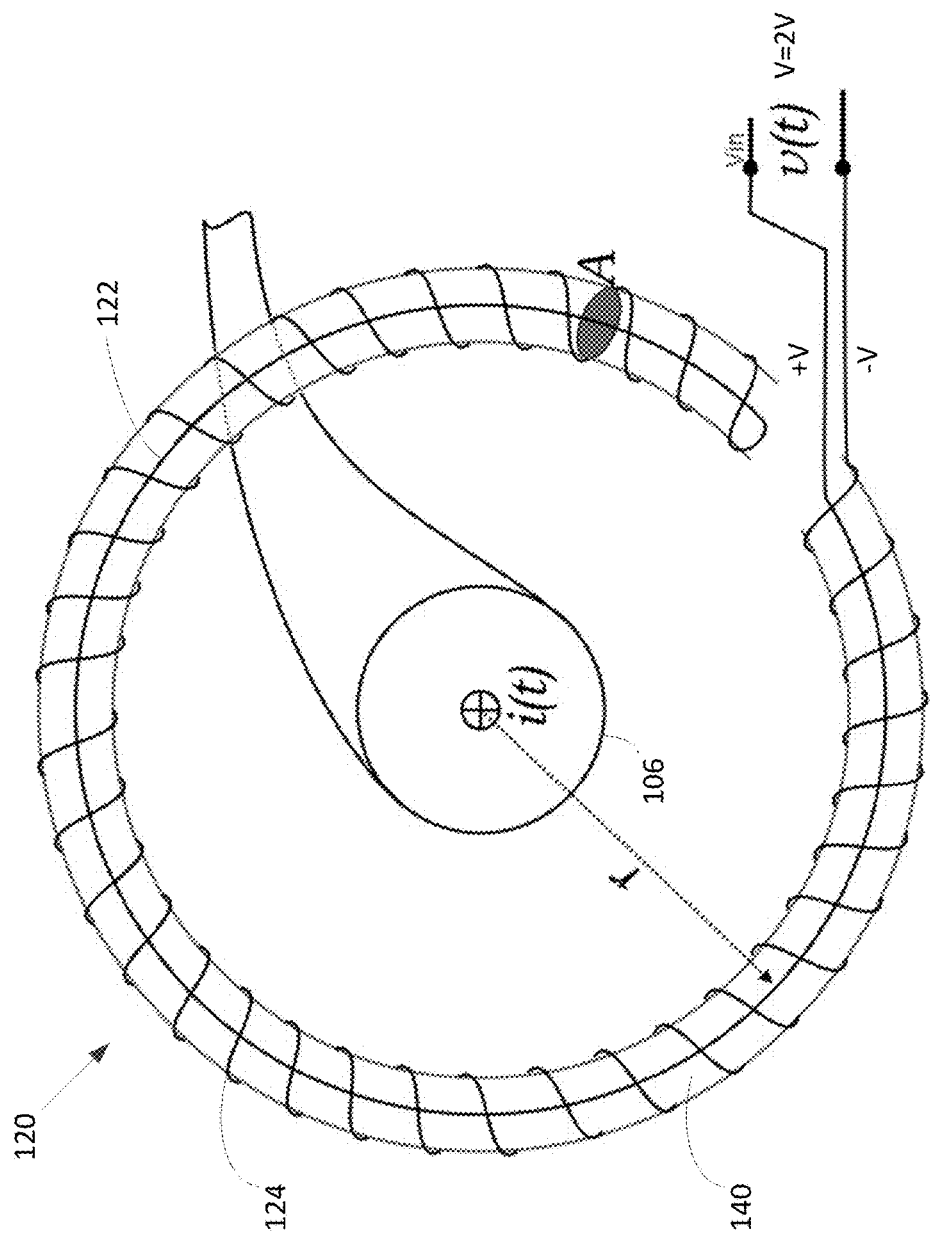
FIG. 2B illustrates a further modified Rogowski coil.

Referring also to FIG. 2B, both loops 122 and 124 may include wound wires, with the second winding 124 being wound in the opposite direction. In this configuration, the voltage induced in the coil 120 from the conductor passing through the coil will be doubled.

Figure 3:
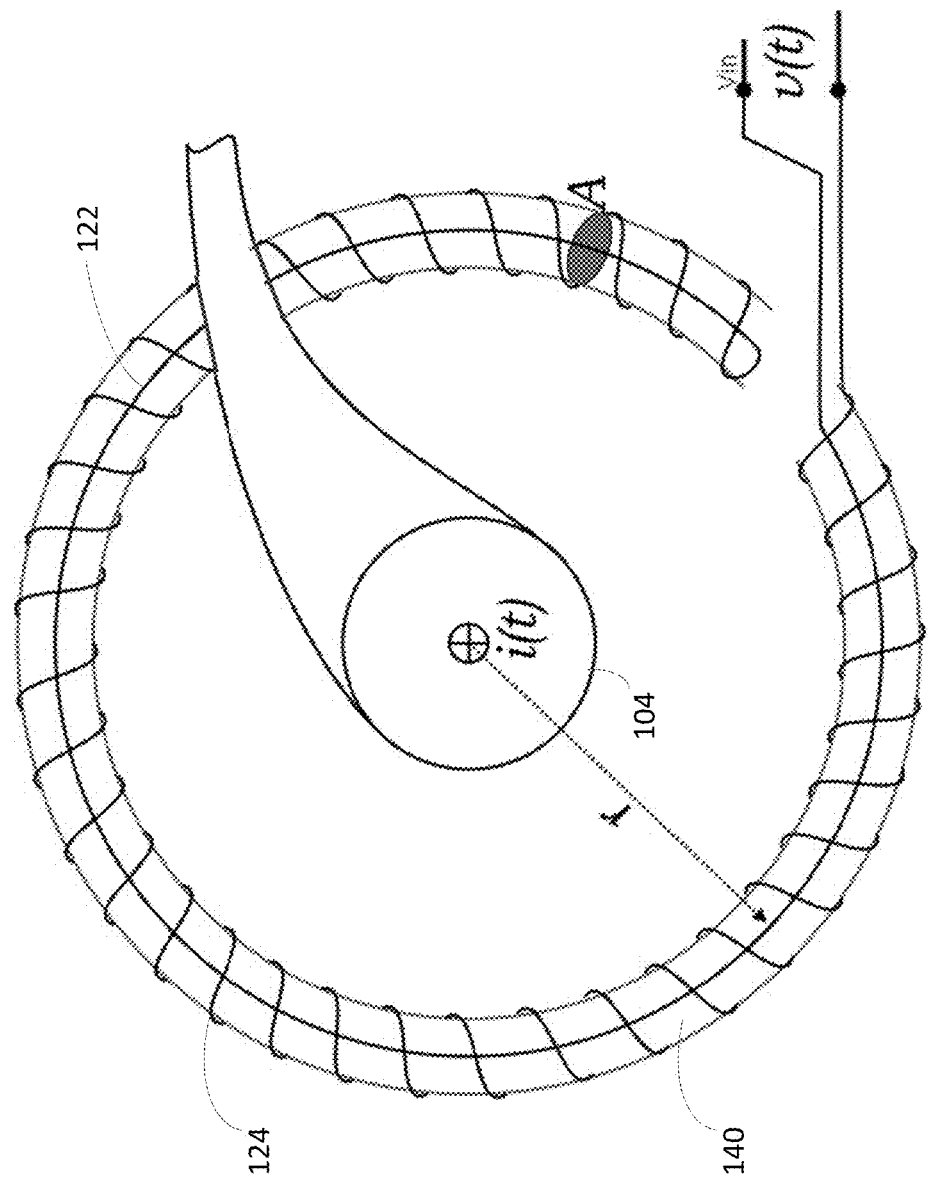
FIG. 3 illustrates a further modified Rogowski coil.

Referring to FIG. 3, a Rogowski coil may include a substantially flexible, nonmagnetic core 140 such as cores commonly used in known coaxial cables. Insulating jackets and shielding from such cables, may be stripped to obtain the cores, and after cutting the cable core to size, the coil 122 (and 124) may be wound over the core 140. Existing conductors extending through the center of the core 140 may serve as the return loop for reduction of external magnetic fields, as described above. In lieu of such flexible cores 140, coils may be fabricated from relatively rigid and straight rods that may be manufactured with a more uniform cross sectional area than the flexible cores. In lieu of such flexible cores 140, coils may be fabricated on dielectric material, such as a patterned circuit board.

The output of the coils tend to be susceptible to noise, signal distortion, and undesirable influences by surrounding conductors and equipment in the vicinity of the coils. To reduce such influences shielding may be included.

Figure 4A:
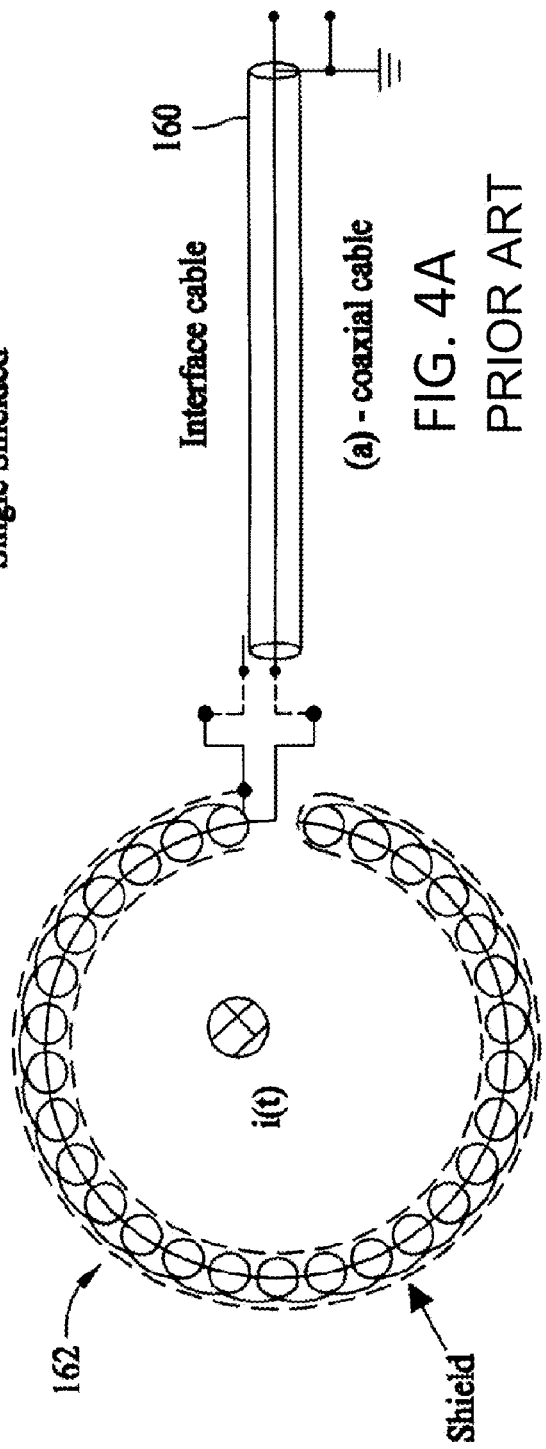
FIG. 4A illustrates a further modified Rogowski coil and connection.
Figure 4B:
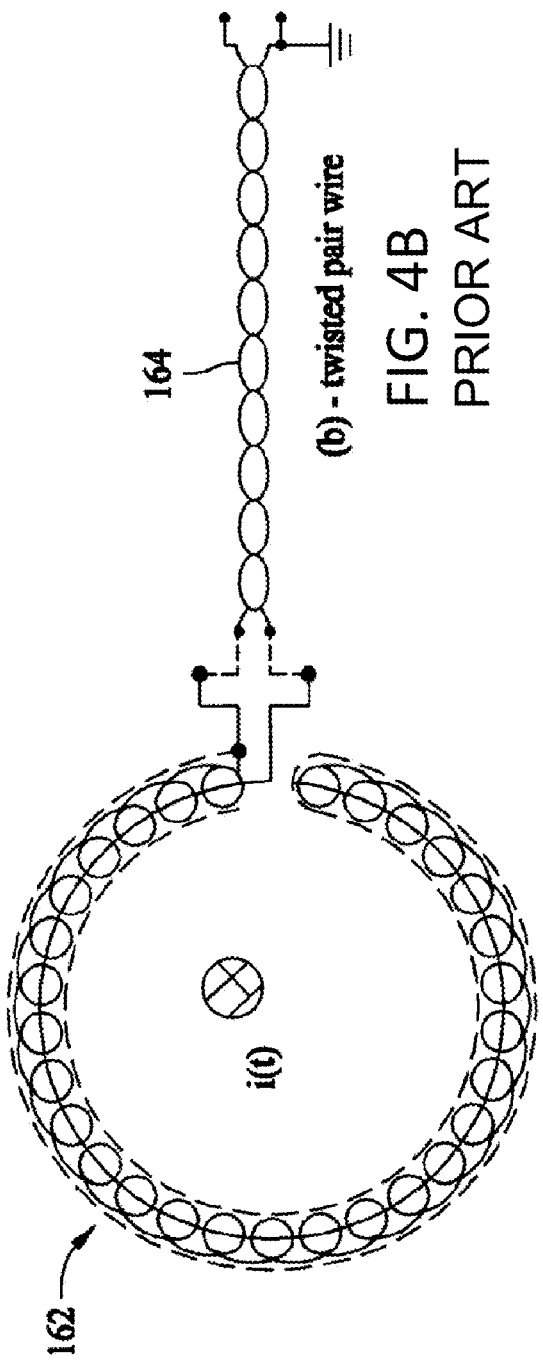
FIG. 4B illustrates a further modified Rogowski coil and connection.

Referring to FIG. 4A, the Rogowski coil and its secondary leads may include a shielded coaxial cable 160 that is connected to a coil 162. Referring to FIG. 4B, a twisted pair wire 164 is connected to the coil 162. The twisted wires carry equal but opposite signals and are less susceptible to noise issues and cross talk issues from adjacent signal conductors. The shielded cable 160 and the twisted pair wire 164 provide protection against noise and electromagnetic influences in the environment of the coils 162.

FIGS. 5A and 5B illustrate another approach for improving the integrity of the coil output signals. FIG. 5A illustrates a double shielded cable 170 having concentric layers of insulation around the signal conductors in the cable. FIG. 5B illustrates a shielded twisted pair wire 172. The double shielding shown in FIGS. 5A and 5B are more effective than the single shielding features shown in FIGS. 4A and 4B.

Figure 6:
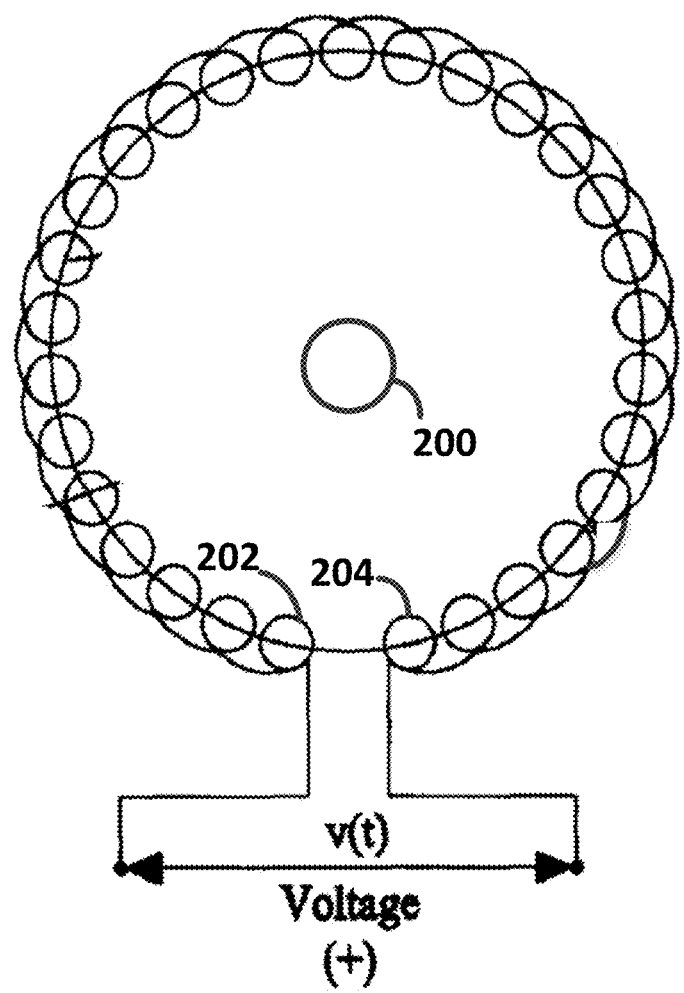
FIG. 6 illustrates a further modified Rogowski coil and connection.
Figure 7:
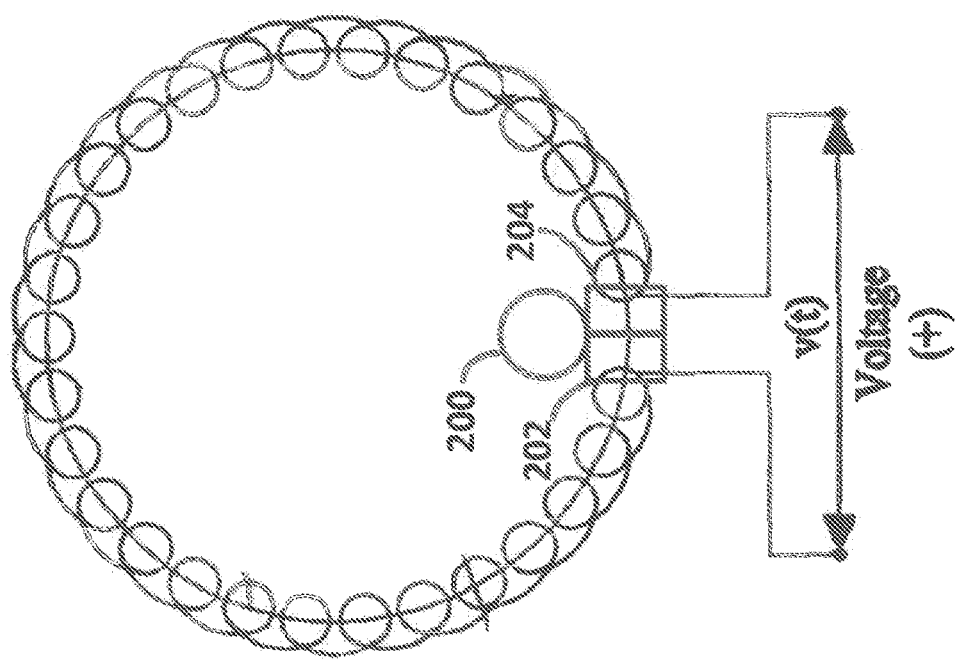
FIG. 7 illustrates a further modified Rogowski coil and connection.
Figure 8:
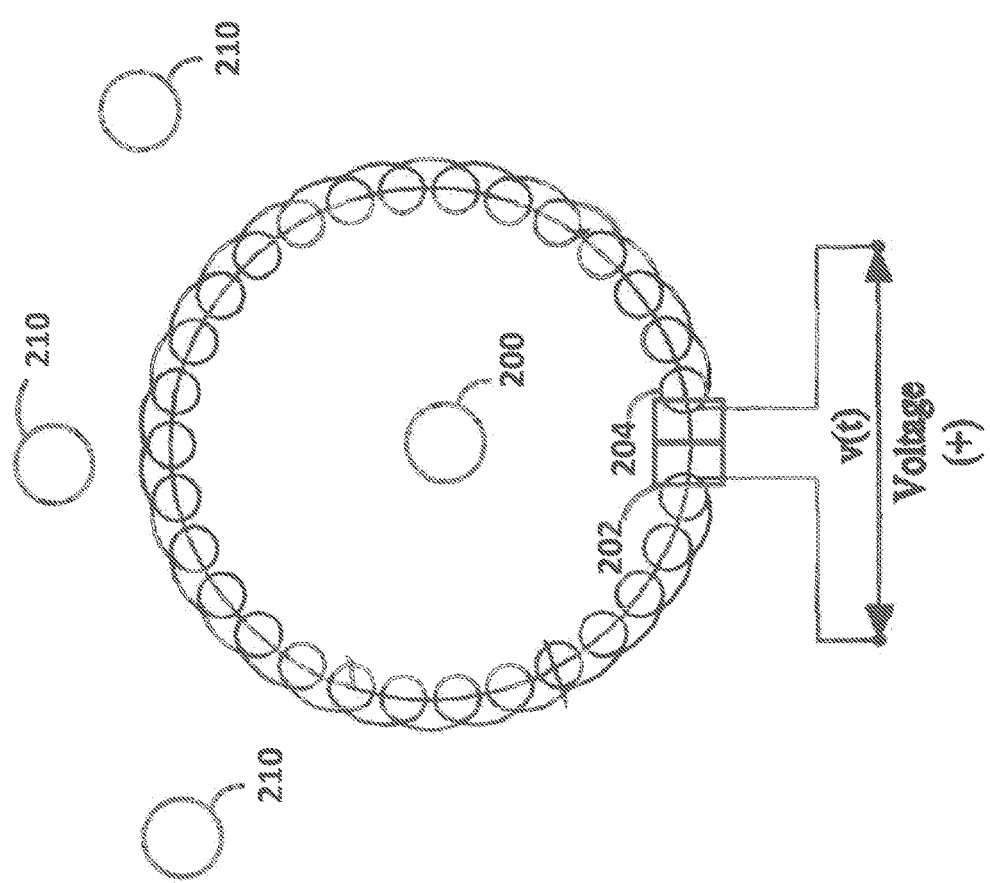
FIG. 8 illustrates a further modified Rogowski coil and connection.

As described, the Rogowski coil may be flexible in shape in order to readily open and close it on the conductor to be measured. This flexibility is especially useful when installing the Rogowski coil around conductors with limited or irregular space constraints. However, the closure system between the ends of the loops from a mechanical perspective (e.g., precision of the positioning of the two ends of the loop) and from an electrical perspective (e.g., the electrical discontinuity of the electrical fields) results in a non-uniformity of the measuring of the fields within the loop. Referring to FIG. 6, a first measurement may be made based upon a first conductor 200 centered within the loop. The measurement will be incorrect due to the non-uniform field created by the closure system between the ends 202, 204 of the loop. Referring to FIG. 7, a second measurement may be made based upon the first conductor 200 located proximate the closure system within the loop. The measurement will be incorrect due to the non-uniform fields created by the closure system within the loop. Referring to FIG. 8, the measurement tends to be incorrect, even with external fielding canceling techniques, due to the non-uniform field created by one or more external conductors 210 in addition to the non-uniform field created by the closure system between the ends 202, 204 of the loop.

Figure 9:
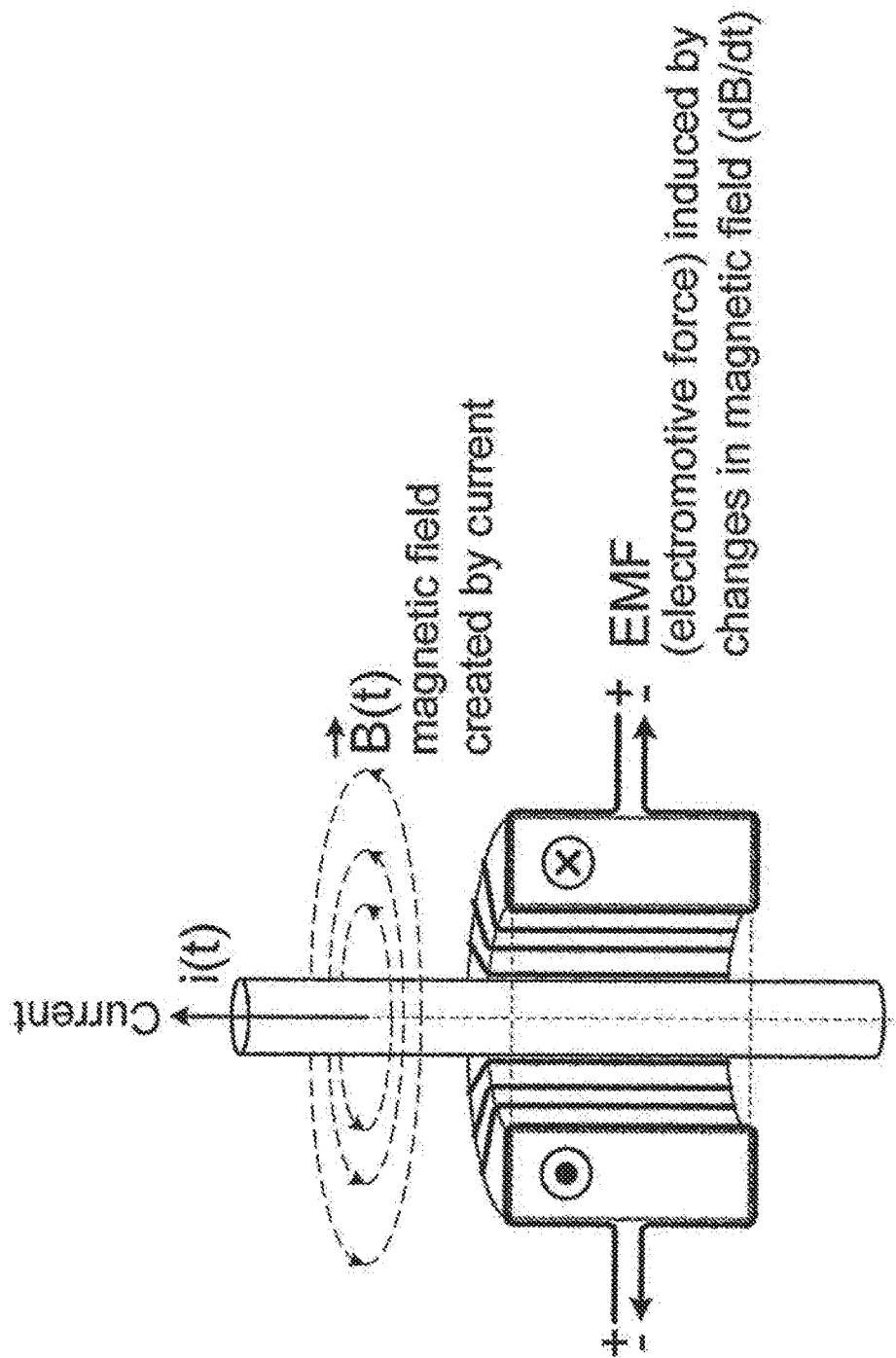
FIG. 9 illustrates a Rogowski coil and its electromotive force.

Referring to FIG. 9, an exemplary diagram of a Rogowski coil arranged around a long straight wire perpendicular to the magnetic field is shown, illustrating the magnetic field (B field) generated by the current i(t). Moreover, as previously described, the EMF may be generally determined by EMF=−Md(i)/dt.

Figure 10:
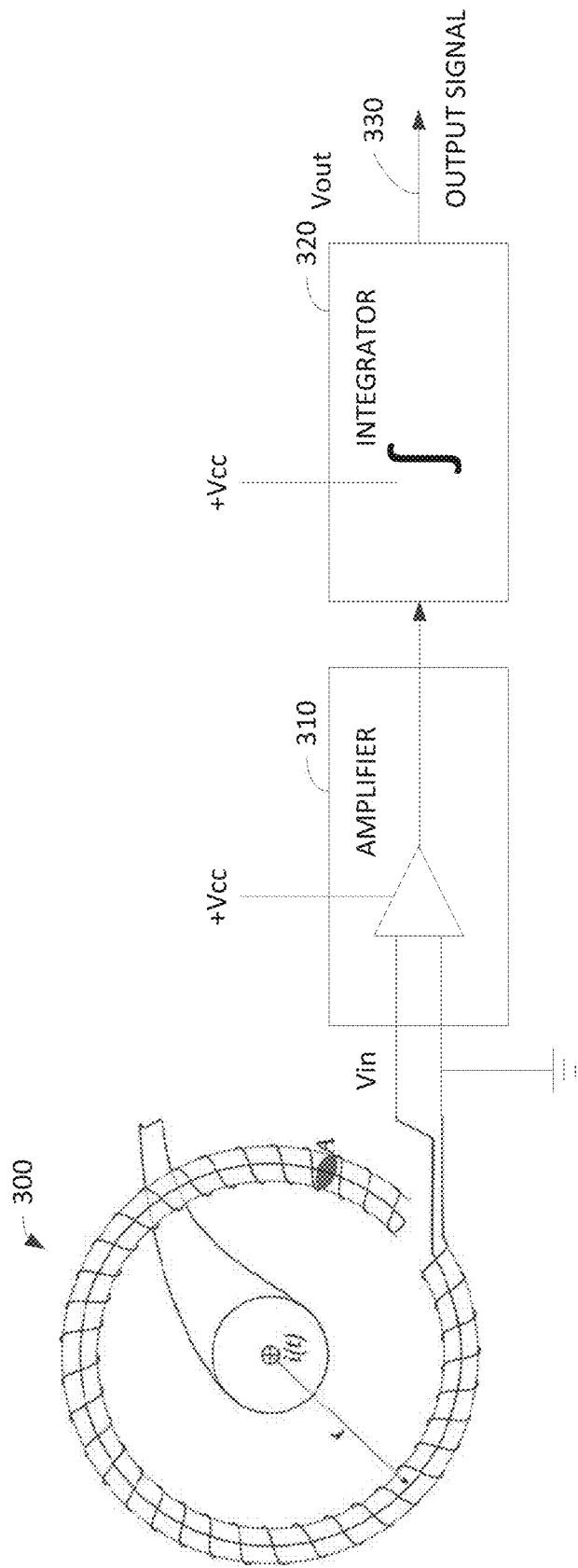
FIG. 10 illustrates a Rogowski coil, together with an amplifier and an integrator.

Referring to FIG. 10, since the output signal from the Rogowski coil 300 tends to be relatively small the signal is preferably amplified using a suitable amplification circuit 310. The output of the amplification circuit 310 is then preferably integrated using an integrator 320 to provide an output signal 330 indicative of the current. The integrator 320 preferably includes compensation for a 90 degree phase shaft and a 20 dB/decade gain generated by the Rogowski coil. It is to be understood that the amplification and/or integration may be performed using firmware using any computing process.

Figure 11:
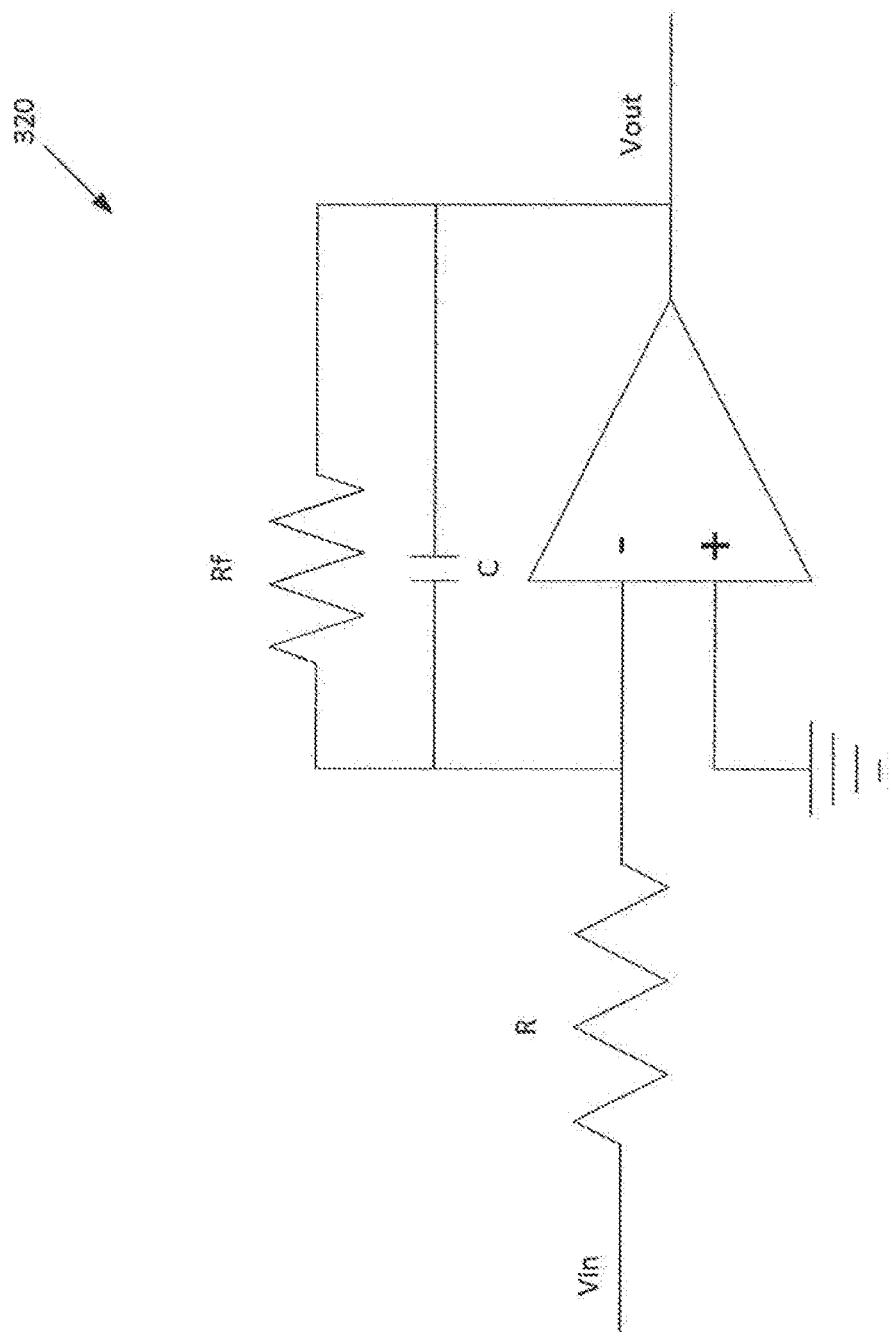
FIG. 11 illustrates an integrator.

Referring to FIG. 11, an exemplary integrator 320 may include an inverting operational amplifier and a resistor-capacitor circuit.

Figure 12:
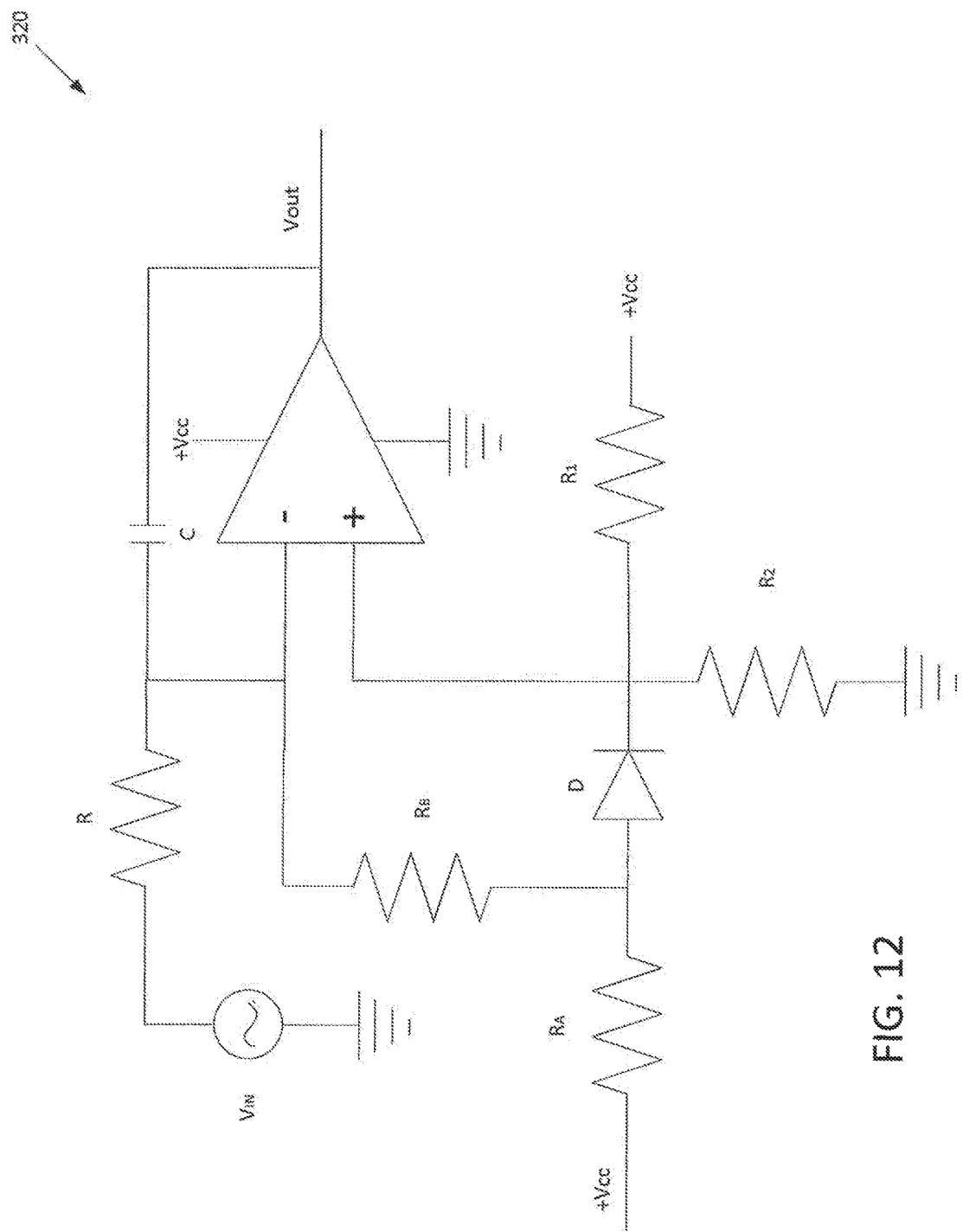
FIG. 12 illustrates another integrator.

Referring to FIG. 12, an exemplary integrator 320 may include an operational amplifier with input current compensation. The resistors R1 and R2 are relatively small, and the resistor $R_B$ is relatively large.

Figure 13:
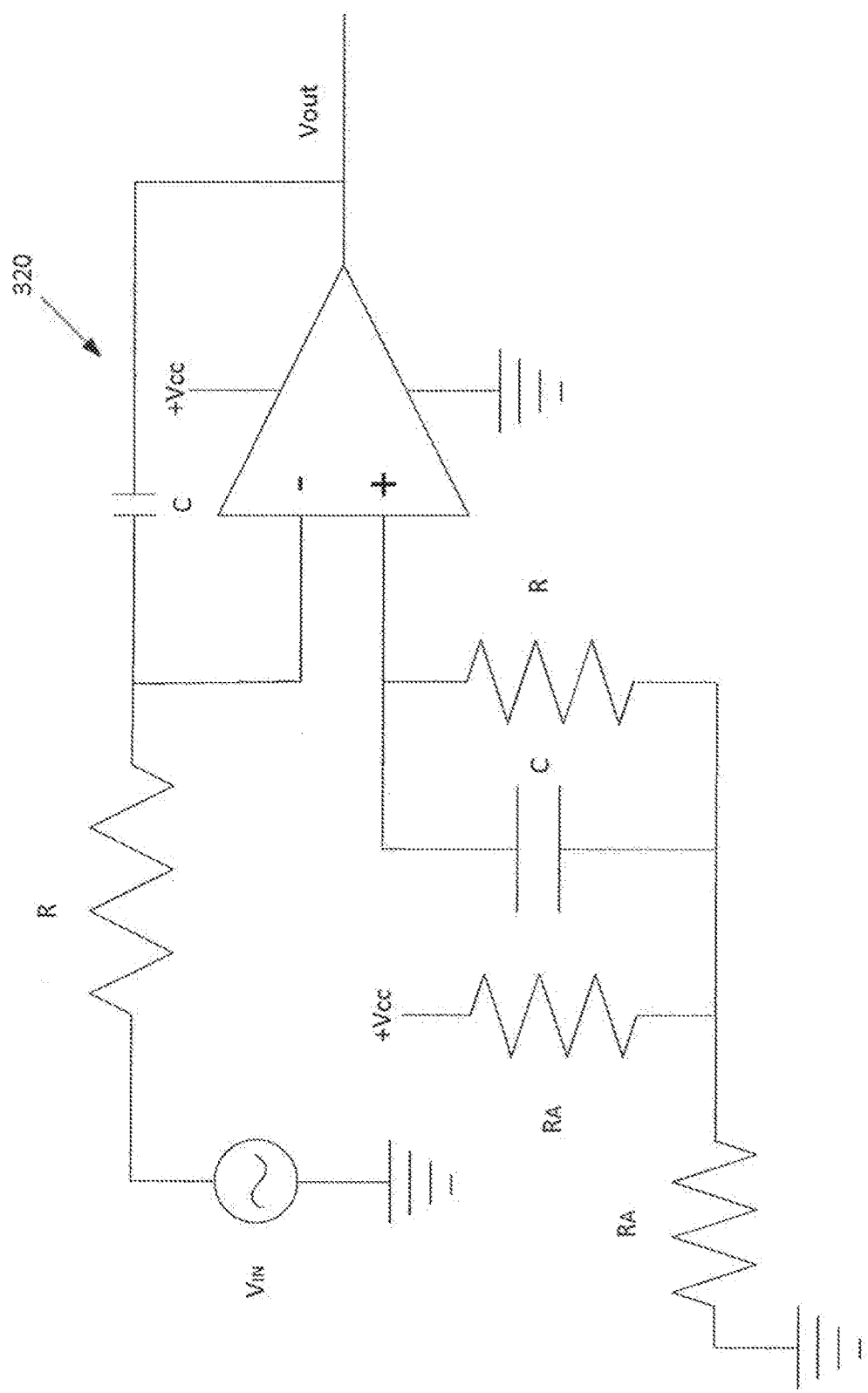
FIG. 13 illustrates another integrator.

Referring to FIG. 13, an exemplary integrator 320 may include an operational amplifier with drift compensation. The positive input current drops the same voltage across the parallel RC combination as the negative input current drops across its series RC combination.

Figure 14A:
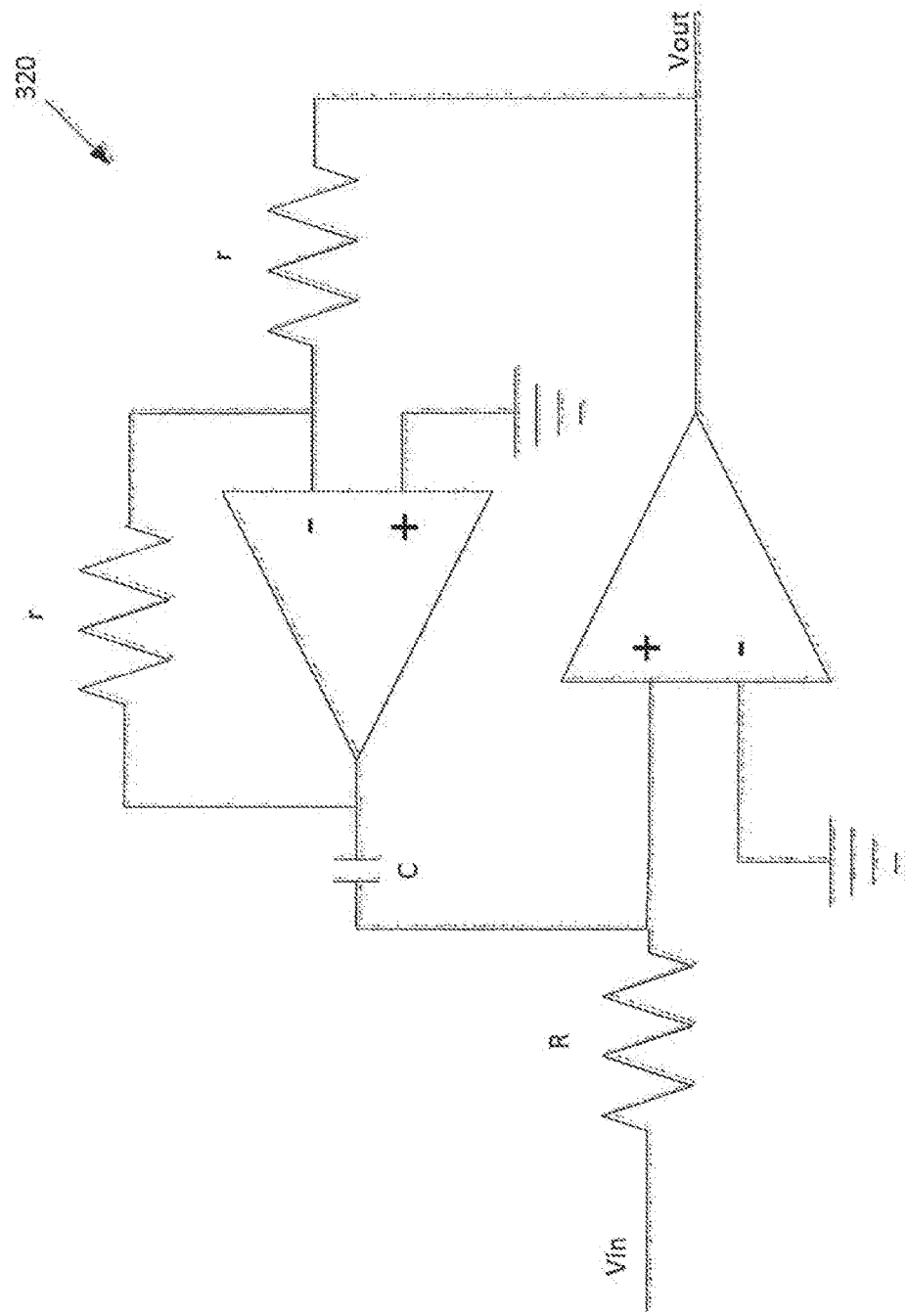
FIGS. 14A-B illustrate other integrators.
Figure 14B:
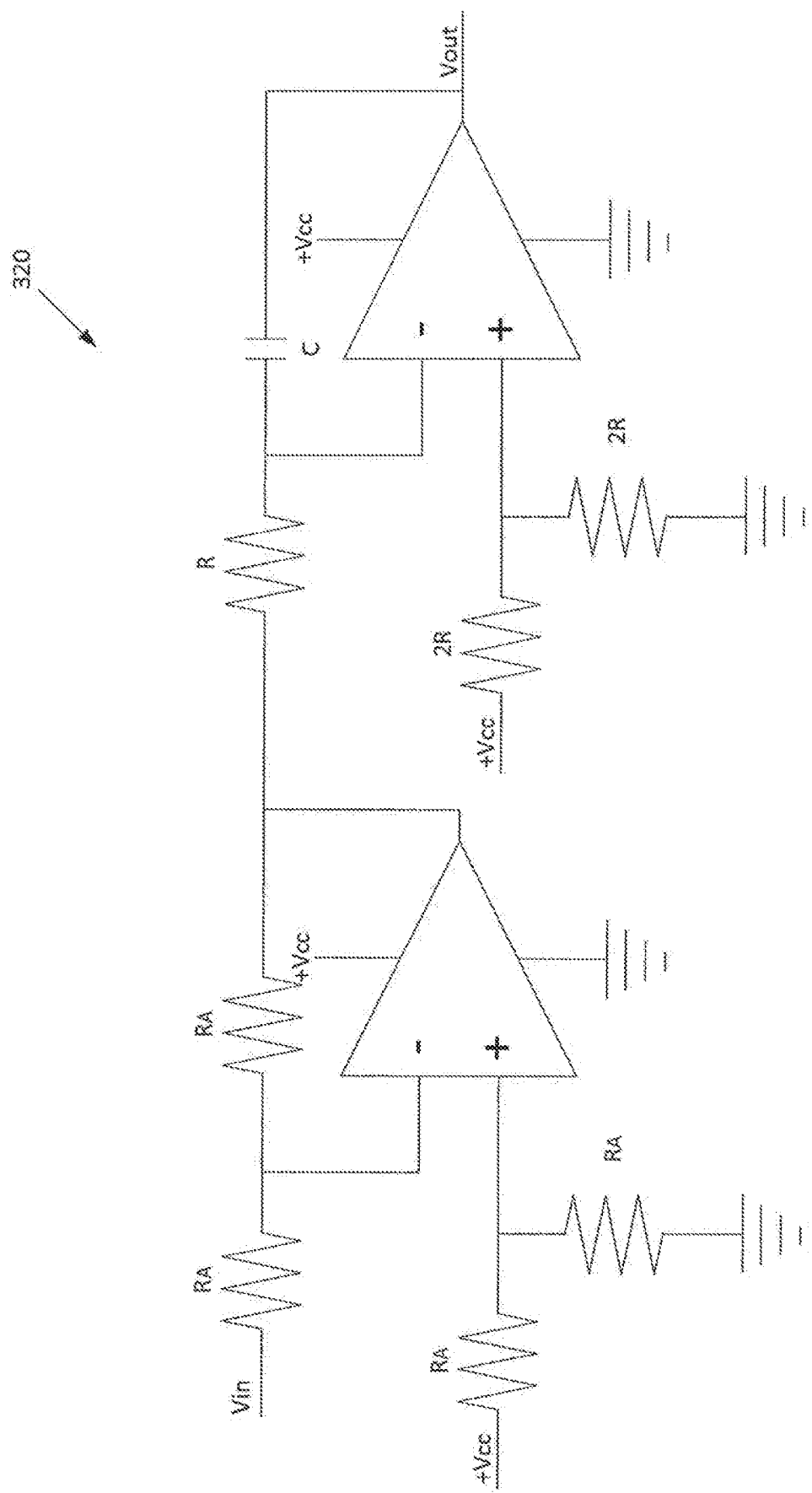

Referring to FIGS. 14A-B, an exemplary integrator 320 may include two operational amplifiers with a non-inverting integrator and an inverting buffer.

Figure 15:
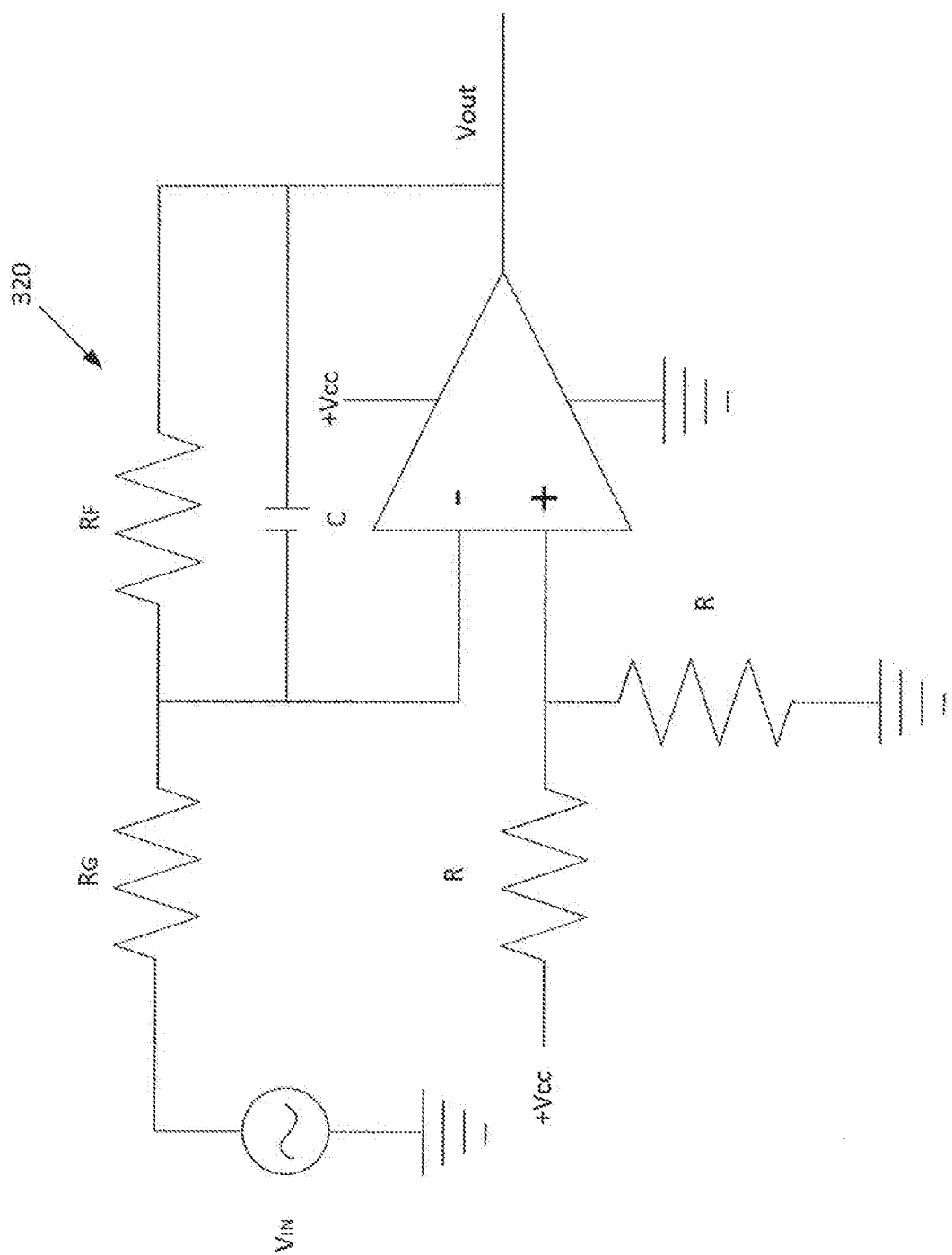
FIG. 15 illustrates another integrator.

Referring to FIG. 15, an exemplary integrator 320 may include an operational amplifier with an inverting integrator with a resistive reset.

Figure 16:
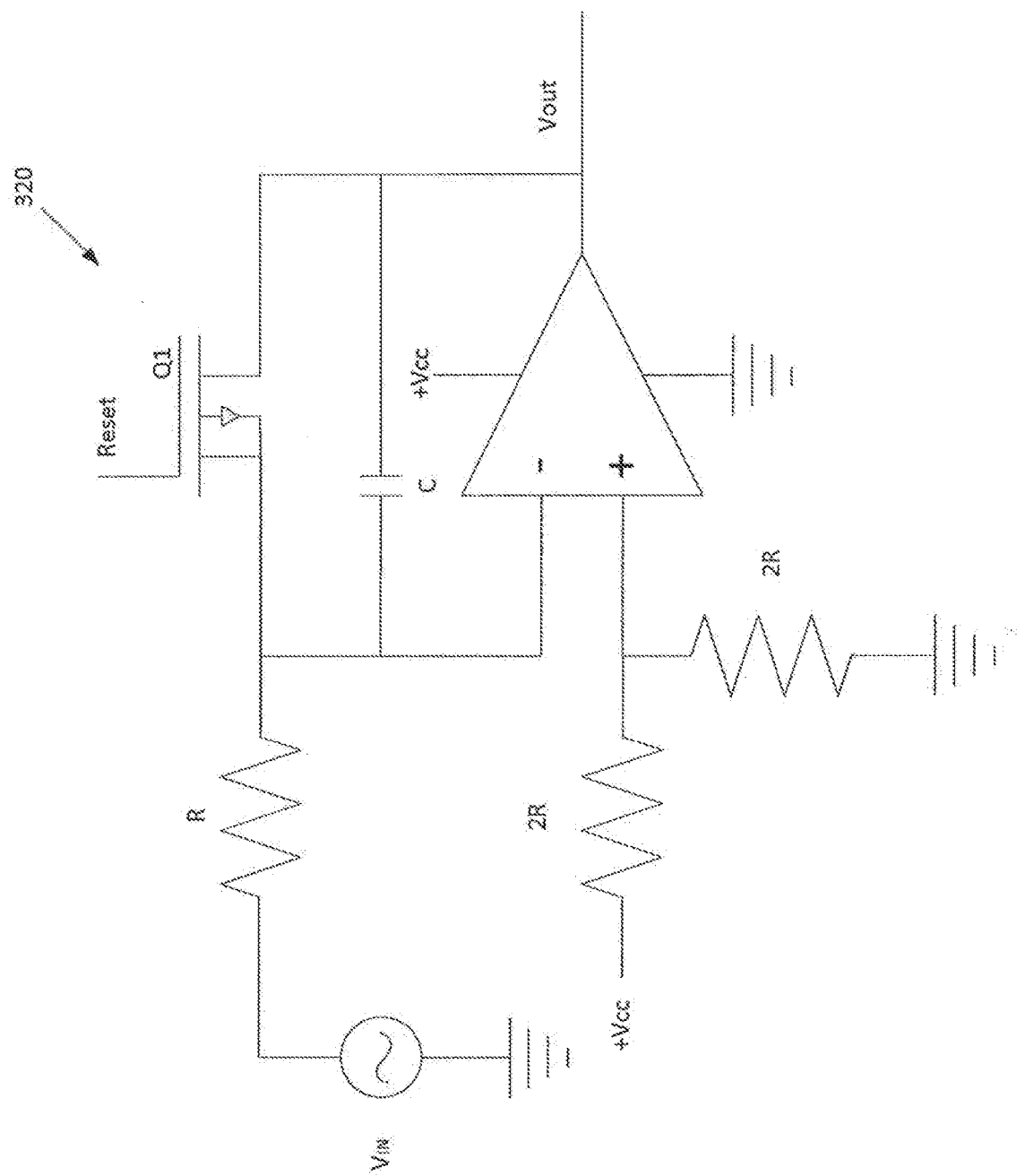
FIG. 16 illustrates another integrator.

Referring to FIG. 16, an exemplary integrator 320 may include an operational amplifier with an inverting integrator with an electronic reset.

It is to be understood that other active circuits may likewise be used, as desired. It is to be understood that a digital integrator may be used, if desired. It is to be understood that passive circuits may likewise be used, as desired.

Figure 17:
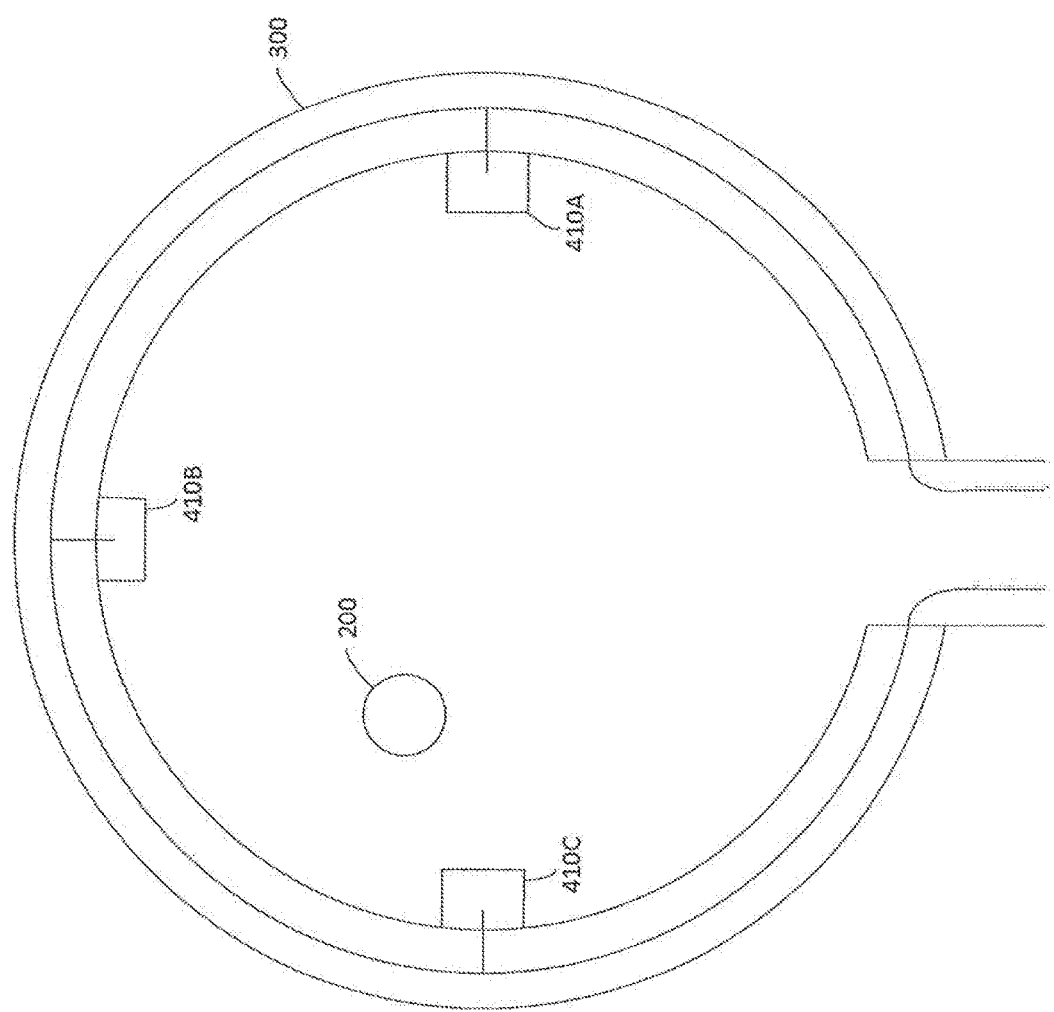
FIG. 17 illustrates a Rogowski coil and non-contact voltage sensors.

It is desirable to use a Rogowski coil to sense the changing current levels within a conductor. In addition, it is desirable to use a voltage tap of the conductor to determine the voltage level so that the current and voltage may be used together with a phase angle, if desired, to determine the power being supplied to the load through the conductor. However, in many environments it is not desirable to include a voltage tap of the conductor which would include piercing the insulating material encapsulating the conductor. Referring to FIG. 17, to overcome the limitations of including a voltage tap together with the Rogowski coil, it is desirable to include one or more a non-contact voltage sensors 410A, 410B, 410C, supported by the Rogowski coil.

Figure 18:
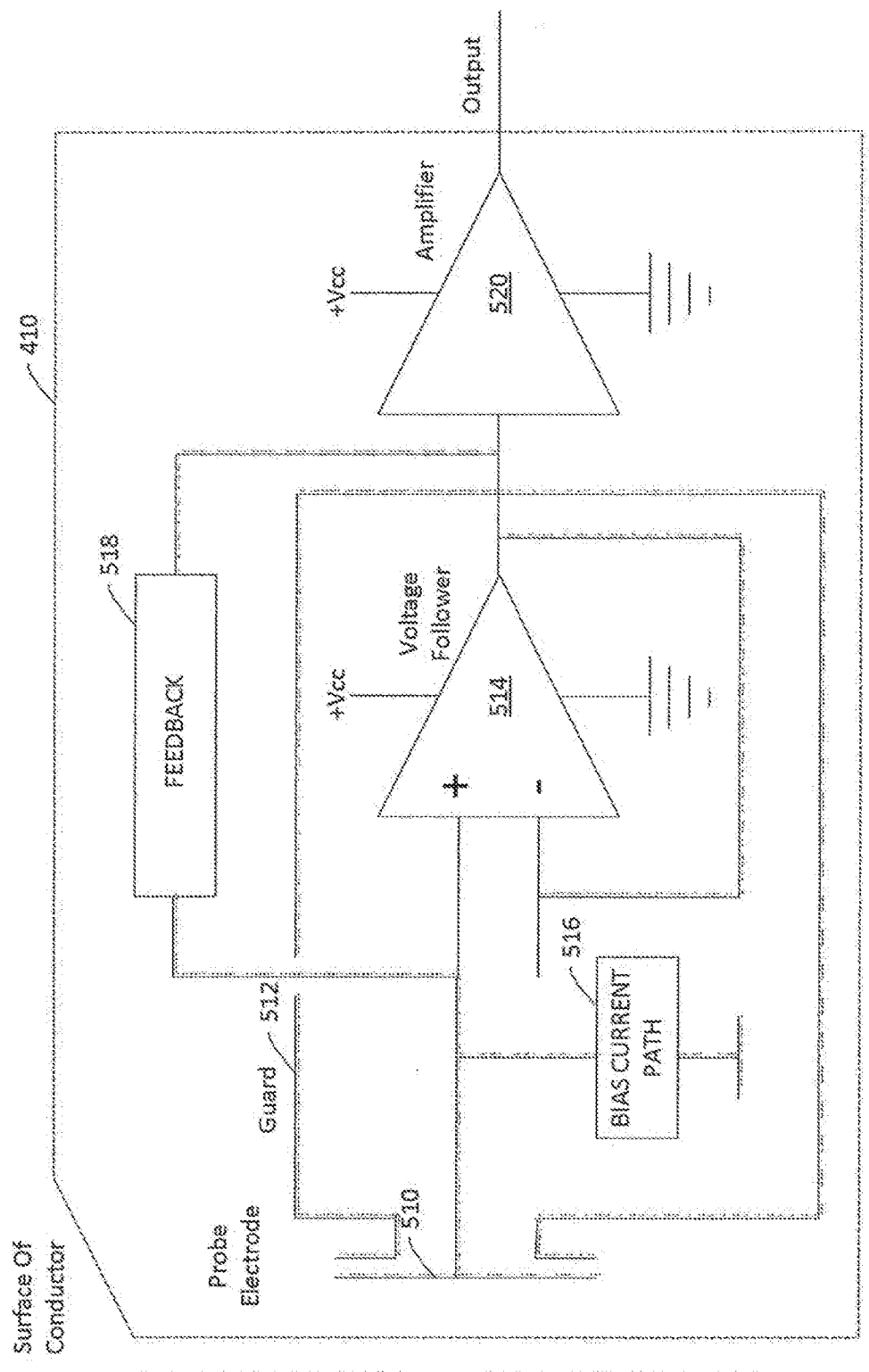
FIG. 18 illustrates an exemplary non-contact voltage sensor.

Referring to FIG. 18, the non-contact voltage sensor 410 may be constructed to measure the spatial electric potential in a manner that the sensor primarily uses displacement current to determine the voltage within the conductor in a non-contact manner. The non-contact voltage sensor may include, for example, a probe electrode 510, a guard path 512, a voltage follower 514, a feedback path 516, a bias current path 518, and an amplifier 520. Other configuration of an electric potential sensor may likewise be used, as desired. Also, other voltage sensors may likewise be used, such as micro-electro-mechanical based sensor.

The voltage potential of the conductor sensed by the voltage sensor 410 will tend to vary with the distance between the voltage sensor 410 and the conductor 200. Also, in a metering environment the distance between the voltage sensor 410 and the conductor 200 is not generally known since the conductor may be at any position within the periphery of the Rogowski coil. To determine a more accurate measurement of the voltage of the conductor 200 within the periphery of the Rogowski coil, a plurality of different electric potential sensor 410A-410C may be used, with each obtaining make a measurement of the voltage potential within the conductor. The three potentially different voltage potentials may be combined together, such as by averaging or any other statistical measure, to estimate the actual voltage potential within the conductor 200. Preferably, a substantially greater number of voltage sensors are supported by the Rogowski coil than three sensors to provide greater accuracy and/or reduced sensitivity of the voltage measurement.

In one embodiment, a voltage sensing module may receive signals from each of the non-contact voltage sensors.

In another embodiment, a voltage sensing module may be proximate each of the non-contact voltage sensors. In another embodiment, a voltage sensing module may be proximate each of the non-contact voltage sensors and receive signals from each of the non-contact voltage sensors. In this manner, the voltage sensing module may be distributed among a plurality of the voltage sensors.

Figure 19:
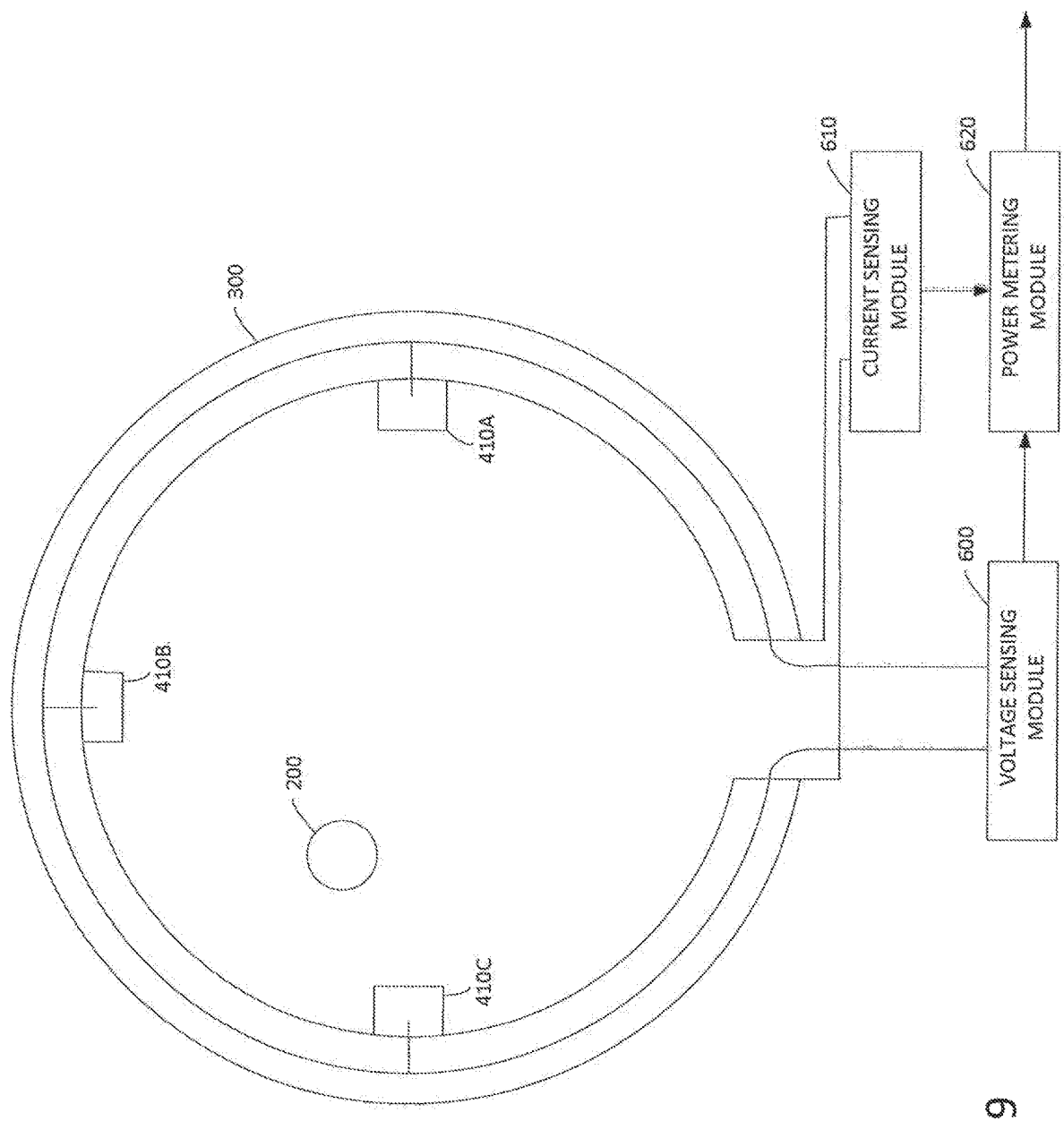
FIG. 19 illustrates a Rogowski coil with a current sensing module, a voltage sensing module, and a power metering module.

Referring to FIG. 19, the Rogowski coil may receive both the voltage signal(s) by a voltage sensing module 600 and the current signal(s) by a current sensing module 610. The voltage and the current signals may be multiplied by one another to determine a power being provided to the load by a power metering module 620. A power factor may be included, if desired. In addition, the voltage sensor cold be a non-contact sensor and/or a separate sensing device.

In another embodiment a conductive based core, such as a ferrite core, may be used as the current transformer. In addition, the current transformer may be a solid core or a split core current transformer.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:

1. A coil for sensing a changing current comprising:
   (a) an elongate substantially flexible core material, said elongate substantially flexible core material having a first end portion and a second end portion, said elongate substantially flexible core material having a middle portion between said first end portion and said second end portion, said second end portion at an opposite end of said elongate substantially flexible core material than said first end portion;
   (b) a conductive sensing member supported by said middle portion of said substantially flexible core material;
   (c) a first non-contact voltage sensor supported by said middle portion of said substantially flexible core material, a second non-contact voltage sensor supported by said middle portion of said substantially flexible core material and spaced apart from said first non-contact voltage sensor, wherein said first non-contact voltage sensor is different than said conductive sensing member, wherein said second non-contact voltage sensor is different than said conductive sensing member;
   (d) said first end portion and said second end portion maintained in a position proximate one another;
   (e) a current sensing module that receives a first input signal from said conductive sensing member and estimates a current conductor signal within a conductor associated with said elongate substantially flexible core material, wherein said current conductor signal is representative of changing current levels in said conductor;
   (f) a voltage sensing module that receives a second input signal from said first non-contact voltage sensor, wherein said second input signal is different than said first input signal, and a third input signal from said second non-contact voltage sensor, wherein said third input signal is different than said first input signal, and estimates a voltage conductor signal within said conductor associated with said elongate substantially flexible core material based upon said second input signal from said first non-contact voltage sensor and said third input signal from said second non-contact voltage sensor, wherein said voltage conductor signal is representative of a voltage level in said conductor.

2. The coil of claim 1 wherein said elongate substantially flexible core material is substantially round in cross section.

3. The coil of claim 1 wherein said current sensing module includes an amplification circuit for said first input signal from said conductive sensing element.

4. The coil of claim 3 wherein said current sensing module includes an integration circuit for said first input signal from said conductive sensing element.

5. The coil of claim 1 wherein said coil includes a plurality of non-contact voltage sensors arranged in a spaced apart location supported by said middle portion of said substantially flexible core material.

6. The coil of claim 5 wherein said voltage sensing module includes a corresponding voltage sensing module proximate each of said plurality of non-contact voltage sensors.

7. The coil of claim 1 wherein said current sensing module includes an amplification circuit and an integration circuit, a plurality of non-contact voltage sensors supported by said substantially non-conductive core, an output from each of said non-contact voltage sensors combined together by said voltage sensing module to estimate said voltage conductor signal within said conductor said at least partially encircled within said elongate substantially non-conductive core material.

8. The coil of claim 7 wherein a power metering module determines a power within said conductor based upon an output of said at least one voltage sensing module and an output of said current sensing module.

* * * * *

UNITED STATES PATENT AND TRADEMARK OFFICE
CERTIFICATE OF CORRECTION

| | |
|---|---|
| PATENT NO. | : 10,545,177 B2 |
| APPLICATION NO. | : 15/178983 |
| DATED | : January 28, 2020 |
| INVENTOR(S) | : Martin Cook |

It is certified that error appears in the above-identified patent and that said Letters Patent is hereby corrected as shown below:

In the Specification

Column 2, Line 13: Replace "104" with --102--.

Signed and Sealed this
Sixth Day of February, 2024

Katherine Kelly Vidal
*Director of the United States Patent and Trademark Office*